(12) United States Patent
Schlueter et al.

(10) Patent No.: US 11,631,974 B2
(45) Date of Patent: Apr. 18, 2023

(54) SNUBBER CIRCUIT AND POWER SEMICONDUCTOR MODULE WITH SNUBBER CIRCUIT

(71) Applicant: Infineon Technologies AG, Neubiberg (DE)

(72) Inventors: Michael Schlueter, Soest (DE); Andre Uhlemann, Wickede (DE)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 16/919,518

(22) Filed: Jul. 2, 2020

(65) Prior Publication Data

US 2021/0006062 A1 Jan. 7, 2021

(30) Foreign Application Priority Data

Jul. 5, 2019 (EP) .................................. 19184691

(51) Int. Cl.
| | |
|---|---|
| *H02H 9/00* | (2006.01) |
| *H03K 17/0814* | (2006.01) |
| *H03K 17/16* | (2006.01) |
| *H05K 1/16* | (2006.01) |
| *H03K 19/0185* | (2006.01) |
| *H01L 29/16* | (2006.01) |

(52) U.S. Cl.
CPC ....... *H02H 9/005* (2013.01); *H03K 17/08142* (2013.01); *H03K 17/161* (2013.01); *H01L 29/1608* (2013.01)

(58) Field of Classification Search
CPC ..... H02H 9/005–007; H03K 17/08142; H03K 17/161; H03K 19/0185; H01L 29/1608; H02M 1/34–348; H05K 1/162–167; H05K 1/182
See application file for complete search history.

(56) References Cited

U.S. PATENT DOCUMENTS

| | | | | |
|---|---|---|---|---|
| 4,916,576 A | * | 4/1990 | Herbert .................. | H01G 4/228 361/734 |
| 5,550,730 A | * | 8/1996 | Seki ..................... | H02M 7/7575 363/132 |
| 5,801,936 A | * | 9/1998 | Mori ................... | H01L 25/0655 363/132 |

(Continued)

FOREIGN PATENT DOCUMENTS

| | | |
|---|---|---|
| JP | 2008166301 A | 7/2008 |
| JP | 2015207739 A | 11/2015 |

*Primary Examiner* — Sisay G Tiku

(74) *Attorney, Agent, or Firm* — Murphy, Bilak & Homiller, PLLC

(57) ABSTRACT

A snubber circuit includes a snubber substrate including an electrically insulating carrier and an electrically conducting structured layer applied thereon, the electrically conducting structured layer including two segments. The snubber circuit further includes two electrically resistive layers, each resistive layer being applied onto the two segments of the electrically conducting structured layer of the snubber substrate, and a capacitor disposed on the electrically resistive layers and having two terminals, each terminal being electrically connected to one of the electrically resistive layers. Further, a power semiconductor module having such a snubber circuit is disclosed.

18 Claims, 5 Drawing Sheets

(56) References Cited

U.S. PATENT DOCUMENTS

| | | | | |
|---|---|---|---|---|
| 5,953,222 | A * | 9/1999 | Mizutani | H03K 17/08148 |
| | | | | 363/56.05 |
| 9,007,795 | B2 * | 4/2015 | Matsuoka | H01L 24/33 |
| | | | | 363/132 |
| 9,013,047 | B2 * | 4/2015 | Imai | H01L 23/315 |
| | | | | 257/787 |
| 10,418,895 | B2 * | 9/2019 | Otake | H01L 23/49822 |
| 10,530,270 | B2 * | 1/2020 | Elserougi | H02M 7/483 |
| 10,855,195 | B2 * | 12/2020 | Dib | H05K 7/20927 |
| 11,152,340 | B2 * | 10/2021 | Mrad | H01L 25/50 |
| 2012/0147641 | A1 | 6/2012 | Yamaguchi et al. | |
| 2013/0049654 | A1 * | 2/2013 | Kure | H02M 3/3376 |
| | | | | 318/400.2 |
| 2016/0013638 | A1 * | 1/2016 | Glas | H01L 27/0248 |
| | | | | 361/56 |
| 2016/0276927 | A1 * | 9/2016 | Das | H01L 23/3735 |
| 2016/0344279 | A1 * | 11/2016 | Kanda | H02H 7/1225 |
| 2018/0182750 | A1 * | 6/2018 | Burke | H01L 29/1095 |
| 2019/0120993 | A1 * | 4/2019 | Han | G01V 3/38 |
| 2020/0066697 | A1 * | 2/2020 | Yoshimura | H01L 28/40 |
| 2020/0083801 | A1 * | 3/2020 | Shimizu | H01L 25/162 |
| 2020/0091061 | A1 * | 3/2020 | Kobayashi | H02M 3/158 |
| 2020/0286864 | A1 * | 9/2020 | Horiguchi | H01L 24/48 |
| 2021/0143147 | A1 * | 5/2021 | Nakano | H01L 23/642 |

\* cited by examiner

|              |                  |               | Silicon                         |                      | Germanium                       |                      |
| ------------ | ---------------- | ------------- | ------------------------------- | -------------------- | ------------------------------- | -------------------- |
| Thickness [µm] | Doping [1/cm3] | Area [cm2]  | Resistivity @ 25°C [Ohmcm]      | Resistance [mOhm]    | Resistivity @ 25°C [Ohmcm]      | Resistance [mOhm]    |
| 100          | 2.00E+14         | 0.5           | 21.60                           | 432                  | 10.00                           | 200                  |
| 100          | 1.00E+15         | 0.3           | 4.48                            | 149                  | 1.70                            | 57                   |
| 500          | 5.00E+14         | 1             | 8.79                            | 439                  | 3.80                            | 190                  |
| 500          | 1.00E+15         | 0.5           | 4.48                            | 448                  | 1.70                            | 170                  |
| 500          | 2.00E+15         | 0.2           | 2.31                            | 577                  | 0.90                            | 225                  |
| 500          | 2.00E+15         | 0.3           | 2.31                            | 384                  | 0.90                            | 150                  |
| 500          | 2.00E+15         | 0.4           | 2.31                            | 288                  | 0.90                            | 113                  |
| 500          | 2.00E+15         | 0.5           | 2.31                            | 231                  | 0.90                            | 90                   |
| 750          | 1.00E+16         | 0.3           | 0.52                            | 131                  | 0.20                            | 50                   |
| 750          | 2.00E+16         | 0.3           | 0.29                            | 72                   | 0.11                            | 28                   |

FIG 13

SNUBBER CIRCUIT AND POWER SEMICONDUCTOR MODULE WITH SNUBBER CIRCUIT

BACKGROUND

1. Technical Field

The disclosure relates to a snubber circuit and a power semiconductor module with a snubber circuit.

2. Related Art

"Snubber circuits", or simply put "snubbers", are frequently used in electrical systems with an inductive load where the sudden interruption of current flowing through the load leads to a sharp rise in voltage across a current switching device (shortly "switching device"). An accordingly generated current transient can be a source of electromagnetic interference (EMI) in other circuits. Additionally, if the voltage generated across the switching device is beyond what the switching device can tolerate, the device may be damaged or destroyed. The snubber provides a short-term alternative current path around the switching device so that the inductive element may be safely discharged.

A simple RC snubber uses a resistor (R) in series with a capacitor (C). An appropriately-designed RC snubber can be used to limit the peak voltage across the switching device when switching an inductive load with either direct current (DC) or alternating current (AC). The voltage across the capacitor cannot change instantaneously, so a decreasing transient current will flow through the capacitor for a short time, allowing the voltage across the switching device to increase more slowly when the switching device is opened.

When the current flowing is DC, a simple rectifier diode may be employed as a diode snubber (also referred to as free-wheeling diode, snubber diode, suppressor diode, or catch diode). The diode is wired in parallel with the inductive load such that it does not conduct under normal operating conditions. When the external driving current is interrupted, the inductor current flows through the diode instead of the switching device. The stored energy of the inductive load is then gradually dissipated by the diode voltage drop and the resistance of the inductive load. The diode must immediately enter into forward conduction mode when the driving current is interrupted. Most ordinary diodes, even "slow" power silicon diodes, are able to turn on very quickly, in contrast to their slow reverse recovery time. These are only sufficient for snubbing electromechanical devices such as relays and motors. In high-speed cases, such as in switching power regulators, ultrafast diodes are required. There are also some designs that use a diode in combination with an RC network.

Snubbers that include a capacitor tend to exhibit a higher power dissipation when higher currents and/or higher switching frequencies are involved. Further, as indicated above snubbers may limit the rate of rise in voltage across the switching device and thus extend the switching time of the switching device. For example, silicon carbide transistors are switching devices adapted for fast switching applications. The faster switching may increase the power dissipation in the snubbers Thus, snubbers for electronic switches such as power semiconductor modules are desired that allow for an increased power dissipation.

SUMMARY

A snubber circuit includes a snubber substrate including an electrically insulating carrier and an electrically conducting structured layer applied thereon, the electrically conducting structured layer including two segments. The snubber circuit further includes two electrically resistive layers, each resistive layer being applied onto the two segments of the electrically conducting structured layer of the snubber substrate, and a capacitor being disposed on the electrically resistive layers and having two terminals, each terminal being electrically connected to one of the electrically resistive layers.

A power semiconductor module includes a module substrate comprising an electrically insulating carrier and an electrically conducting structured module layer applied thereon, the electrically conducting structured layer including multiple segments. The power semiconductor module further includes at least one semiconductor switching device disposed on the module substrate and electrically connected to the electrically conducting structured layer, and at least one snubber circuit disposed on the module substrate and connected via the electrically conducting structured layer of the module substrate to the at least one semiconductor switching device. The snubber circuit includes a snubber substrate including an electrically insulating carrier and an electrically conducting structured layer applied thereon, the electrically conducting structured layer including two segments. The snubber circuit further includes two electrically resistive layers, each resistive layer applied onto the two segments of the electrically conducting structured layer of the snubber substrate, and a capacitor disposed on the electrically resistive layers and having two terminals, each terminal being electrically connected to one of the electrically resistive layers.

Other systems, methods, features and advantages will be, or will become, apparent to one with skill in the art upon examination of the following detailed description and appended figures. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 13 is table illustrating multiple implementations of such resistive semiconductor layers for different types of semiconductor materials.

DETAILED DESCRIPTION

Figure 1:
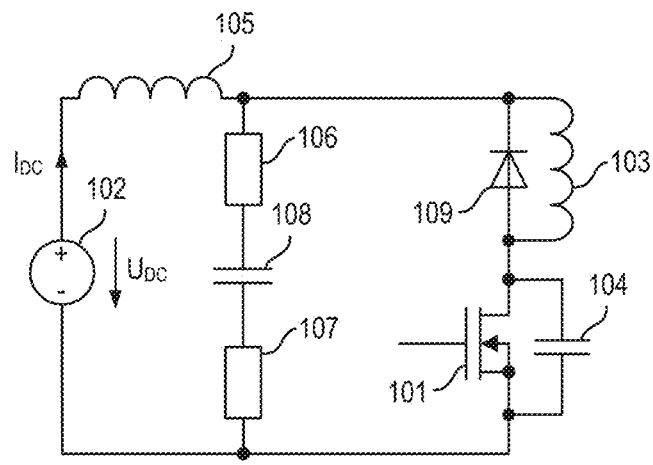
FIG. 1 is a circuit diagram illustrating an exemplary snubber circuit employed in connection with a semiconductor switching device.

Referring to FIG. 1, an exemplary semiconductor switch having a snubber circuit includes a switching device 101, e.g., a silicon carbide metal-oxide field-effect transistor or any other appropriate semiconductor switch such as an insulated gate bipolar transistor, metal-oxide field-effect transistor etc., which has a gate terminal G for receiving control signals, a source terminal S that is connected to a first (e.g., negative) terminal of a direct current (DC) power source 102, and a drain terminal D that is connected to a first terminal of an inductive load 103. The switching device 101 includes a parasitic chip capacitance 104 between the source terminal S and the drain terminal D, which is consequently connected in parallel to a load path of the switching device 101, i.e., the path between the source terminal S and the drain terminal D thereof. A second terminal of an inductive load 103 is connected via a parasitic line inductance 105 to a second (e.g., positive) terminal of the power source 102. A snubber circuit includes a diode 106 that is connected in parallel to the inductive load 103 such that it does not conduct under normal operating conditions, i.e., in the example shown, a cathode of diode 106 is connected the first and an anode thereof to the second terminal of the inductive load 103. The snubber circuit further includes an RC element having two series-connected damping resistors 106 and 107 in series with a snubber capacitor 108. In this example, the sum of the resistances of the damping resistors 106 and 107 is damping resistance referred to herein below.

The snubber circuit described above in connection with FIG. 1 may be adapted in two different ways. In view of one of these ways, to successfully limit over-voltage, the snubber capacitor 108 is commonly adapted to allow for accumulating all energy from the parasitic line inductance 105 and from the power source 102 in the time period between the point of switching and the occurrence of a first peak voltage. An accordingly adapted capacitor has a relatively large capacitance and, thus, is large in terms of exterior dimensions. When any parasitic line inductances in between are neglected, the peak voltage across the snubber capacitor 108 is approximately equal to the voltage across the parasitic chip capacitance 104 of switching device 101, and thus across the load path of the switching device 101. The not attenuated oscillation frequency $f_0$ of the resonance circuit based on the parasitic line inductance 105 and the snubber capacitor 108 can be described as:

$$f_0 = \frac{1}{2\pi\sqrt{L_S \cdot C_{Snub}}},$$

wherein $L_S$ represents the inductance value of the parasitic line inductance 105 and $C_{Snub}$ represents the capacitance value of the snubber capacitor 108. At ¼ of the cycle duration, i.e., at $t_{Umax}=¼ \cdot f_0$, the energy accumulated by the snubber capacitor 108 is maximum and so is the voltage across the snubber capacitor 108. The peak voltage $U_{Snubmax}$ across the snubber capacitor 108 can be described as:

$$U_{Snubmax} = \sqrt{\frac{E_{C_{Snub}0} + E_{L_S} + E_{DC_{Source}}}{\frac{1}{2}C_{Snub}}},$$

wherein $E_{C_{Snub}0}$ is the energy accumulated in the snubber capacitor 108, $E_{L_S}$ is the energy accumulated in the parasitic line inductance 105, and $E_{DC_{Source}}$ is the energy provided by the power source 102.

Figure 2:
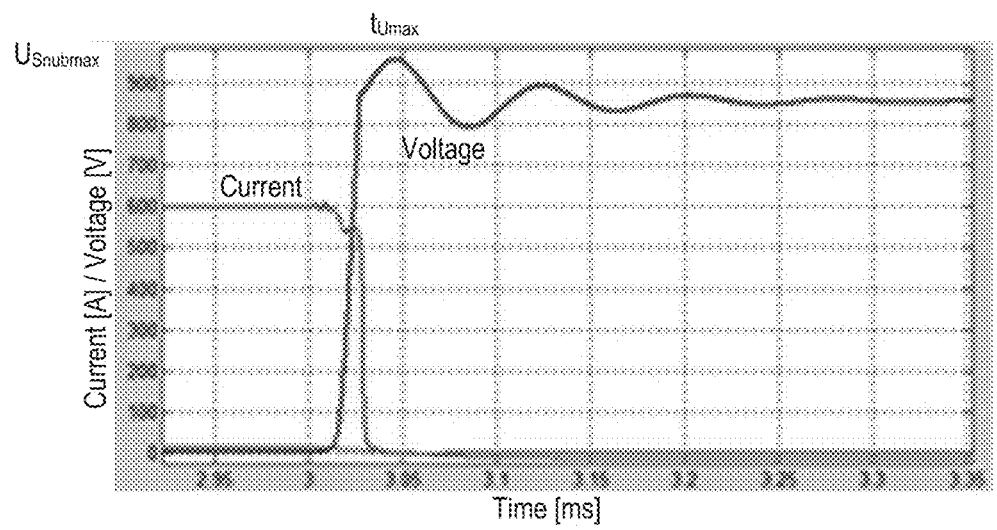
FIG. 2 is a current/voltage-time diagram illustrating an exemplary curve of the current through and the voltage across the switching device shortly before and after switching.

FIG. 2 illustrates the current I in [A] through and the voltage U in [V] across the switching device 101 over time after switching the switching device 101 off, provided the damping resistance is sufficient small, i.e., significantly smaller than a resistance for critical damping. initially, the current I is maximum and drops shortly before the point in time $t_{Umax}$. Inversely, the voltage U raises shortly before the point in time $t_{Umax}$ from approximately zero to maximum at the point in time $t_{Umax}$ with a certain transient curve.

Figure 3:
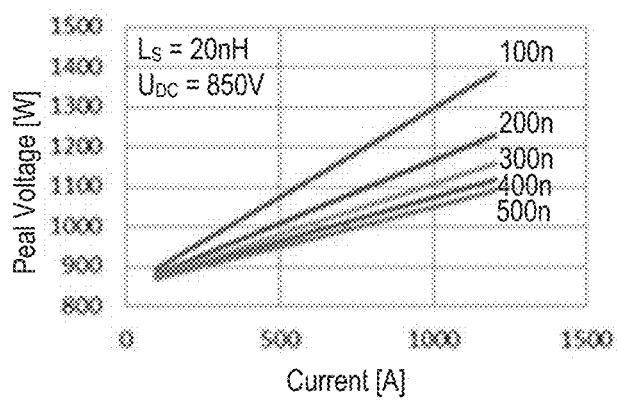
FIG. 3 is a voltage-current diagram illustrating exemplary curves of the peak voltage across the snubber capacitor vs. the current provided by the power source for various capacitance values of the snubber capacitor.

The corresponding peak voltage $U_{Snubmax}$ allows for determining the required capacitance value $C_{Snub}$ of the snubber capacitor 108. FIG. 3 depicts for an exemplary inductance value $L_S=20$ nH of the parasitic line inductance 105 and a voltage $U_{DC}$ provided by the power source 102 the peak voltage $U_{Snubmax}$ over a current $I_{DC}$ provided by the power source 102, which is equal to a current $I_L$ through the parasitic line inductance 105.

Figure 4:
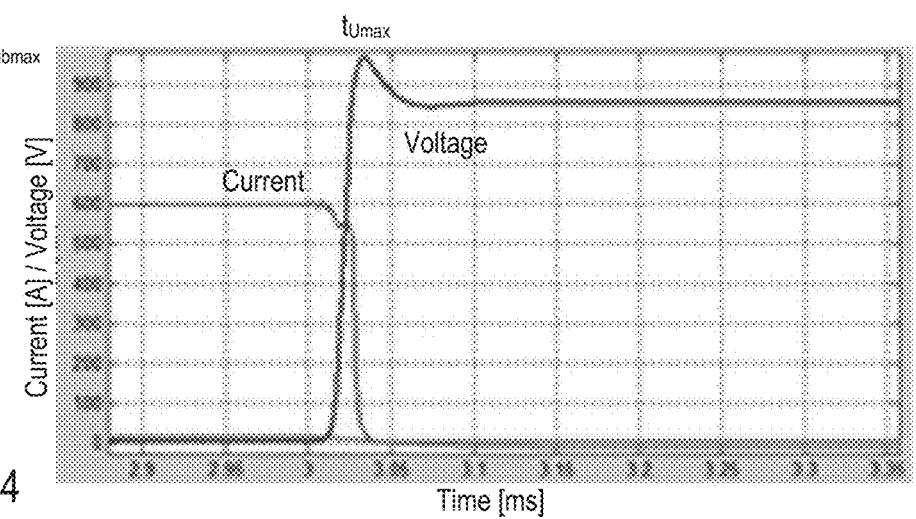
FIG. 4 is a side view of is a current/voltage-time diagram illustrating an exemplary curve of the current and voltage across the snubber capacitor shortly before and after switching with aperiodic damping of the snubber circuit.

In order to damp the oscillation of the resonance circuit, a damping resistance may be inserted, which additionally to the damping of the oscillation also generates a phase shift that shifts the point of time when the peak voltage occurs towards the point of time of switching off. The shift of the peak voltage is apparent from a comparison of FIG. 4 with FIG. 2. A resistance value $R_{adamp}$ of an inserted damping resistance required for aperiodic damping can be determined according to:

$$R_{adamp} = 2 \cdot \sqrt{\frac{L_S}{C_{Snub}}},$$

For example, for an inductance value $L_S=20$ nH and a capacitance value $C_{Snub}=500$ nF, the resulting resistance value $R_{adamp}=400$ mΩ. Due to the occurrence of the peak voltage close to the switch-off point in time, the power dissipation may increase so that an Ohmic resistance may be self-defeating. For a damping resistance having the resistance value $R_{adamp}=400$ mΩ and a current value $I_{DC}=500$ A, the power dissipation is $$P_{peak}=R_{damp} \cdot I_{DC}^2=100 \text{ kW}.$$

The average power dissipation $P_{AVG}$ can be determined from the product of a switching frequency $f_{sw}$ and the energy accumulated in the parasitic line inductance 105, the product being multiplied by 2 to address on and off switching, according to:

$$P_{AVG}=2 \cdot f_{sw}(\frac{1}{2} \cdot L_S \cdot I_{DC}^2).$$

Figure 5:
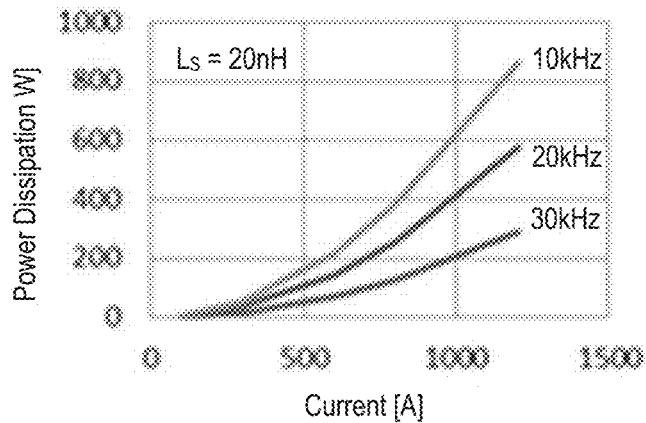
FIG. 5 is a voltage-current diagram illustrating exemplary curves of the power dissipation of the damping resistance vs. the current provided by the power source for various switching frequencies.

The electrical power $P_{AVG}$ is converted into heat by the damping resistance. Therefore, the damping resistance value may be selected on the one hand to be as low as possible so that the peak voltage occurs after switching in order to dissipate as little energy as possible from the parasitic line inductance 105 in the inserted damping resistance. On the other hand, the damping resistance value may be selected to be as high as possible in order to outweigh frequency dependent parasitic resistances occurring on intermediate connections such as bus bars and, thus, to unload these parasitic resistances. In the example outlined above, such parasitic resistances may amount to between 150 mΩ and 350 mΩ. FIG. 5 depicts the power dissipation for an inductance value $L_S=20$ nH dependent on the current Inc provided by the power source 102 at different frequencies.

In the other way, the snubber circuit may be adapted to reduce its oscillation. When a higher peak voltage is tolerated, a snubber capacitor with less capacitance and, thus, with smaller dimensions can be employed. However, under certain circumstances the peak voltage across the snubber capacitor 108 and, correspondingly, across the load path of the switching device 101, may then be even higher with the snubber circuit than across the switching device 101 without a snubber circuit. For example, if the capacitance of the snubber capacitor 108 is so small that ¼ of the cycle duration of the oscillation is more or less the rise/fall time of the switching device, the switch-off voltage ($L_S \cdot di/dt$) across the load path of the switching device 101 is superimposed by the oscillation. In the example outlined above, without a snubber circuit an over voltage across the load path of the switching device may exceed 200V and di/dt may be much more than 10 A/ns, e.g., up to 40 A/ns.

Figure 6:
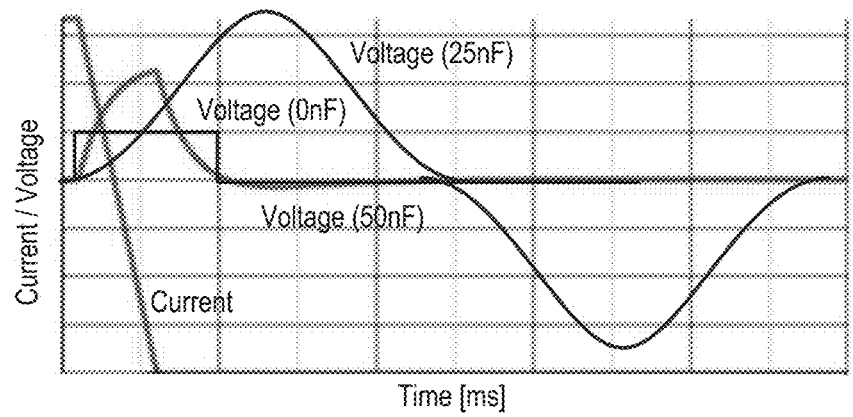
FIG. 6 is a current/voltage-time diagram illustrating an exemplary curve of the current and voltage across the snubber capacitor shortly before and after switching for various capacitance values of the snubber capacitor.

A snubber circuit whose snubber capacitance 108 has a capacitance of 25 nF may generate a voltage of 730V across the load path of the switching device 101. If the switch device can tolerate voltages higher than the voltages that occur without snubber circuit, the damping resistance can be adapted to generate critical damped oscillations in the snubber circuit. FIG. 6 depicts by way of voltage time curve and a current time curve the behavior of the load path current $I_d$ of the switching device and the voltage $V_d$ across the load path for a capacitance value of 50 nF of the snubber capacitance, a fall time of 50 ns, and a damping resistance value $R_{adamp}$ of 1,26Ω. The resulting peak voltage is here 623V. FIG. 6 shows for comparison also the curves for the voltage $V_d$ across the load path for a capacitance value of 25 nF and 0 nF (no snubber).

Because of the higher peak voltage across the load path of the switching device, the power dissipation and, thus, the heat dissipation of the switching device increases compared to the design described above as a first way to adapt the snubber circuit. In turn, the power dissipation and the heat dissipation of the damping resistance then decreases. When increasing the resistance value of the damping resistance, the snubber is less effective and the effects of the chip capacitor 104 may no longer be negligible, i.e., it may have a significant impact on the oscillation behavior. As can be seen from the above considerations in connection with the two ways of adapting the snubber circuit, the damping resistance value can be selected from a wide range of values, which means de facto that, to implement the damping resistance, also resistors can be used that exhibit broad manufacturing and temperature coefficient variations.

Figure 7:
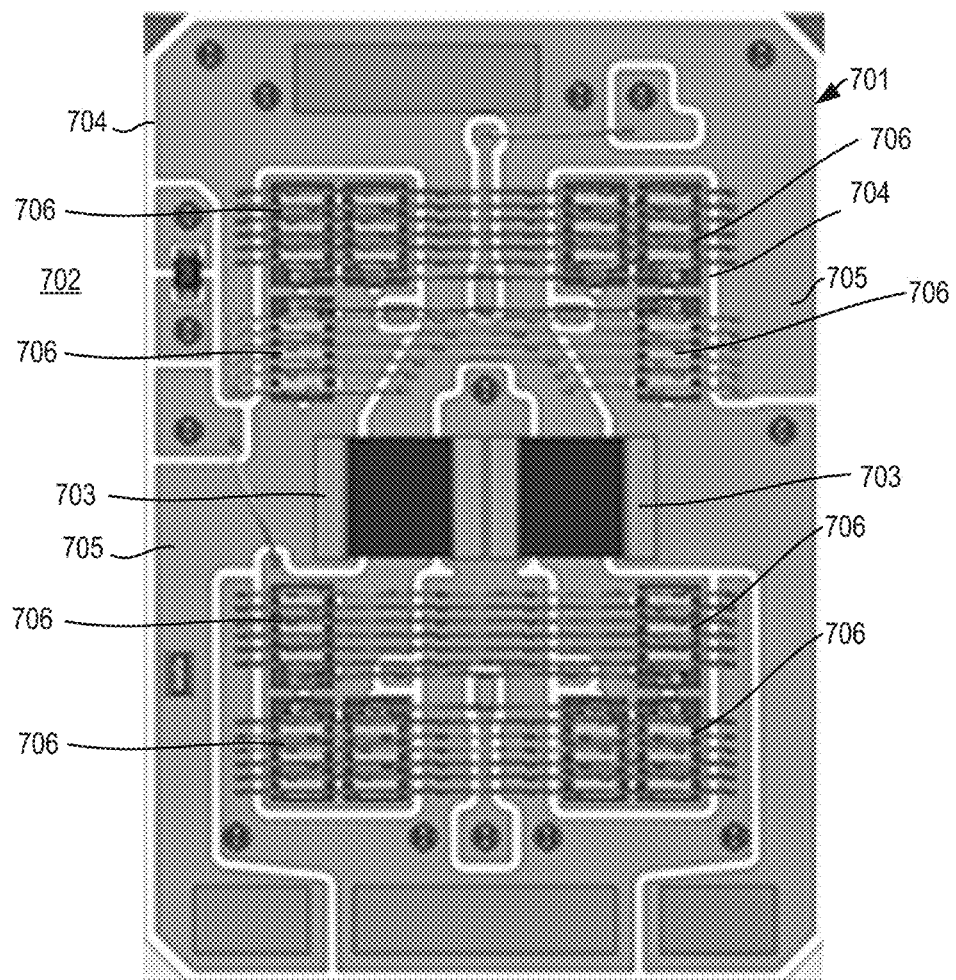
FIG. 7 is a top view of a substrate of an exemplary power semiconductor module that includes at least one snubber circuit.

Referring back to the above-described first way for adapting the snubber circuit, as a snubber circuit to be effective requires low parasitic inductances, particularly in the connection paths of the switching device, in the example shown in FIG. 7 a substrate 701 of a power semiconductor module 702 with a very compact arrangement is used that, regardless of the compactness, allows for sufficient thermal dissipation, and that is able to include (two) capacitors 703 with larger dimensions due to their higher capacitances. The substrate 701 may be a printed circuit board (PCB), direct copper bonding (DCB) substrate or any other substrate with an electrically insulating carrier 704 with an electrically conducting, structured (patterned) layer 705 thereon that interconnects various devices, such as and including switching devices 706, arranged on the substrate 701. The arrangement used in this example employs a snubber circuit that includes a stapled construction of two resistors and at least one capacitor close to the switching devices 706 (for interconnections see resistors 106, 107 and capacitor 108 in FIG. 1). For example, the capacitors 703 have two larger parallel surfaces extending between their terminals and are arranged so that the two larger parallel surfaces are in parallel to at least one larger surface of the substrate 701. The capacitors 703 are spaced from the substrate each terminal of the capacitors 703.

Examples for such stacked snubber circuits are illustrated below in connection with FIGS. 8-11. Further, electrically conductive layers or pieces may also be arranged between the capacitor terminals and the resistor(s) and/or between the resistor(s) and the electrically conductive, structured layer of the substrate, (e.g., a metal layer pattern).

Figure 8:
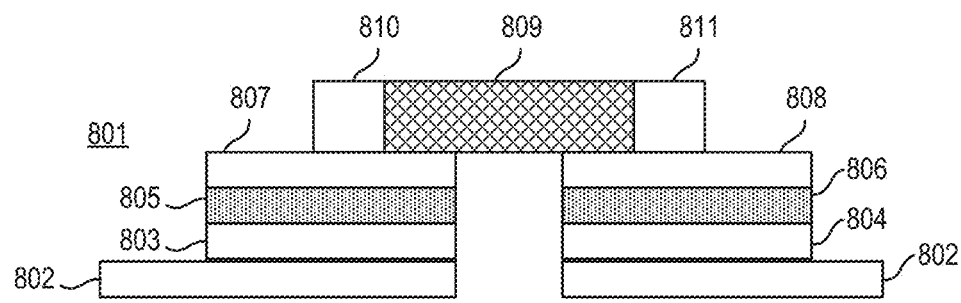
FIG. 8 is a cross-sectional view of an exemplary snubber circuit including a stack of connection layers, resistive layers and a capacitor with cuboid end caps as terminals.

FIG. 8 depicts an exemplary "stacked" snubber circuit 801 which is attached to two segments of a structured metal layer 802. The snubber circuit 801 includes electrically conductive, flat first connection layers 803 and 804 (e.g., solder or sheet metal layers) that are each connected to one of the segments of the structured metal layer 802. Each of the first connection layers 803 and 804 carries a flat resistive layer 805 and 806, respectively, so that the resistive layers 805 and 806 are connected on one side to the first connection layers 803 and 804, respectively, and on an opposite side to electrically conductive, flat second connection layers 807 and 808, respectively. The second connection layers 807 and 808 connect the two terminals of a capacitor 809, which are arranged at two opposite, lateral ends of the capacitor 809, to the second connection layers 807 and 808. The two terminals 810 and 811 of the capacitor 809 have the shape of a cuboid end cap and are made from electrically conducting material.

Figure 9:
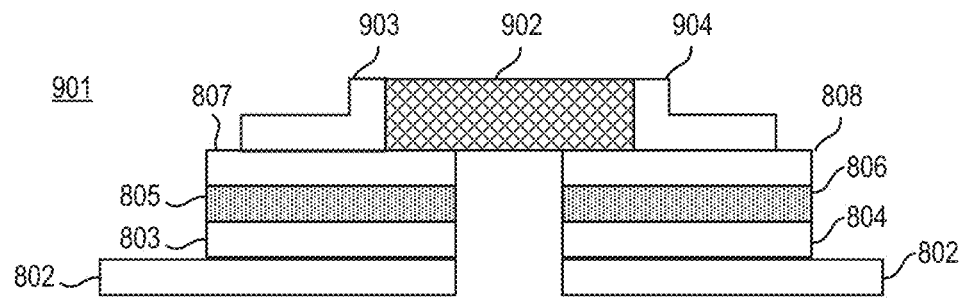
FIG. 9 is a cross-sectional view of an exemplary snubber circuit including a stack of connection layers, resistive layers and a capacitor with L-shaped terminals.

Another exemplary "stacked" snubber circuit 901 shown in FIG. 9 is identical with the snubber circuit shown in FIG. 801 with the exception of the capacitor 809, which is substituted by a capacitor 902. Instead of the two terminals of the capacitor 809 that have the shape of a cuboid end cap, the capacitor 902 has, for example, L-shaped terminals which may provide a larger contact area. Alternatively, other shapes such as J-shapes are applicable. J-shapes allow the terminals to extend under the capacitor.

Figure 10:
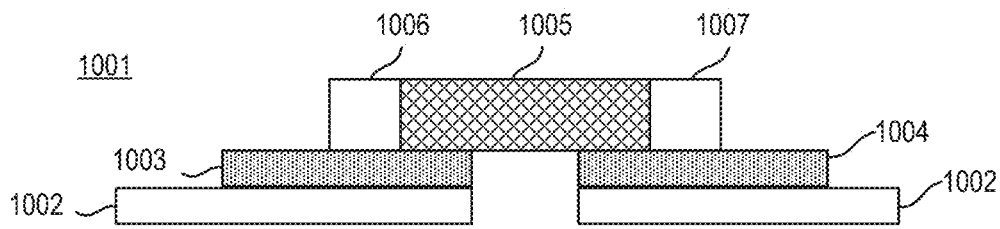
FIG. 10 is a cross-sectional view of an exemplary snubber circuit including a stack of resistive layers and a capacitor with cuboid end caps as terminals.

FIG. 10 depicts another exemplary "stacked" snubber circuit 1001 which is attached to two segments of a structured metal layer 1002. The snubber circuit 1001 includes two, for example flat, resistive layers 1003 and 1004, which are connected on one side to the two segments of a structured metal layer 1002, and on an opposite side to two terminals 1006 and 1007 of a capacitor 1005, which are arranged at two lateral ends of the capacitor 1005. The two terminals 1006 and 1007 of the capacitor 1005 have the shape of a cuboid end cap made from electrically conducting material. The resistive layers may optionally be made, for example, from adequate electrically conductive adhesive or other material such as electrically conductive polymers or doped semiconductor material.

Figure 11:
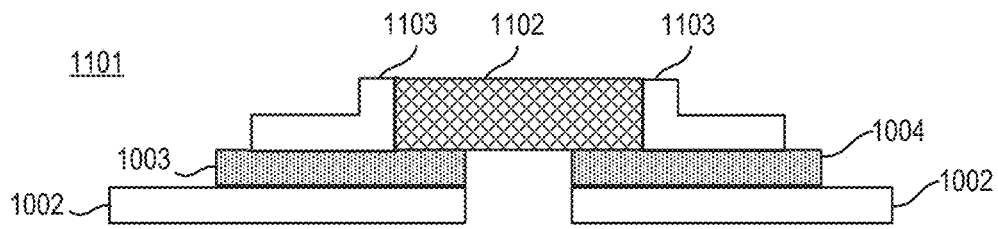
FIG. 11 is a cross-sectional view of an exemplary snubber circuit including a stack of resistive layers and a capacitor with L-shaped terminals.

Another exemplary "stacked" snubber circuit 1101 shown in FIG. 11 is identical with the snubber circuit shown in FIG. 1001 with the exception of the capacitor 1005, which is substituted by a capacitor 1102. Instead of the two terminals of the capacitor 1005 that have the shape of a cuboid end cap, the capacitor 1102 has L-shaped terminals which may provide a larger contact area.

According to FIG. 7, at least one snubber circuit including the capacitor 703 (only a part of the snubber circuit is visible in FIG. 7) may be disposed in or near the center of the substrate 701 and/or in close distance to the switching devices 706 to allow for a short interconnection distance to ensure low parasitic inductances, particularly in the connection paths between the switching device and the snubber circuit. FIGS. 8-11 are cross-sections of possible stacked and, thus, very compact snubber circuits applicable as the snubber circuit in the semiconductor module shown in FIG. 7. Resistors, resistances or resistive layers used in the stacked snubber circuit may be made from electrically conductive adhesives, sintered (powder) metal or other resistive material with a suitable resistivity.

In order to achieve a satisfactory peak power behavior of the resistors, resistances or resistive layers, the distribution of the power dissipation within the resistor, resistance or resistive layer may be made homogenous, e.g., by employing conductive material with a homogenous resistivity distribution and a sufficient high overall resistivity. Further, the resistor, resistance or resistive layer may be formed to be relatively flat, i.e., a large sized base area with a small height relative to the substrate. Resistors, resistances or resistive layers with a short distance in the direction of current flow and a large cross section perpendicular to the direction of current flow are not commonly available. The electrically resistive layers may have a height that is equal to or less than ⅕ of the square root of a basic area of the respective electrically resistive layer. For the following considerations it is assumed that the electrically resistive layer has a height that is ¹/₁₀ of the square root of a basic area of the respective electrically resistive layer For example, to implement a 300 mΩ resistor or restive layer for a height of 1 mm and a base area of 1 cm², material having a resistivity with a value $\rho=0.3\ \Omega\cdot100\ mm^2/0.001\ m=0.03\ \Omega m$ is required. Common resistive materials exhibit typically values that are significantly below 0.03 Ωm. To meet all the requirements outlined above, a semiconductor material such as silicon or silicon carbide (e.g., in the form of a semiconductor layer) with adequate doping may be used. Such material exhibits a high temperature coefficient of resistance, e.g., due to the temperature dependence of the charge carrier mobility, which however has a minor influence in snubber applications as detailed above.

Figure 12:
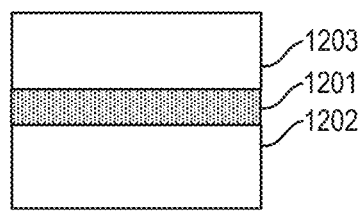
FIG. 12 is a cross-sectional view of an exemplary damping resistor including a doped semiconductor layer and two metallic heat capacitances.

In order to further improve the peak power behavior of the resistors, resistances or resistive layers, they may be or include a doped semiconductor layer 1201 that is laminated on its two major surfaces with metal layers 1202 and 1203 as shown in FIG. 12. The metal layers 1202 and 1203 create a type of heat capacitance and may include at least one of copper and aluminum. The connection layers described above in connection with FIGS. 8 and 10 can be designed to (additionally) have the effect of a heat capacitance.

The semiconductor resistors can be seen as a (semiconductor) material with a homogenous resistivity distribution when neglecting all effects that arise from semiconductor junctions, for example between differently n-doped materials such as N+ (contact), N− (resistive layer) and N+ (further contact), from the edge construction (considering only the active area) of the semiconductor, from the dependency on the mobility of the current density/electric field strength, from the avalanche breakdown field strength, and from the power dissipation. In this case, the resistance R can be described as $$R=\rho_A\cdot(d/A),$$

wherein $\rho_A$ represents the aerial resistivity, d represents the thickness of the layer and A represents the base area of the layer. FIG. 13 is table illustrating multiple implementations of such resistive semiconductor layers for two types of semiconductor materials, e.g., silicon and germanium.

The description of embodiments has been presented for purposes of illustration and description. Suitable modifications and variations to the embodiments may be performed in light of the above description. The described circuits and modules are exemplary in nature, and may include additional elements and/or omit elements.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects.

While various embodiments of the invention have been described, it will be apparent to those of ordinary skilled in the art that many more embodiments and implementations are, possible within the scope of the invention. In particular, the skilled person will recognize the interchangeability of various features from different embodiments. Although these techniques and systems have been disclosed in the context of certain embodiments and examples, it will be understood that these techniques and systems may be extended beyond the specifically disclosed embodiments to other embodiments and/or uses and obvious modifications thereof.

What is claimed is:

1. A snubber circuit, comprising:
   a snubber substrate comprising an electrically insulating carrier and an electrically conducting structured layer applied thereon, the electrically conducting structured layer of the snubber substrate including two segments;
   two electrically resistive layers, each resistive layer being applied onto the two segments of the electrically conducting structured layer of the snubber substrate; and
   a capacitor disposed on the electrically resistive layers and having two terminals, each terminal being electrically connected to one of the electrically resistive layers.

2. The snubber circuit of claim 1, further comprising:
first electrically conductive interconnecting layers disposed between the two electrically resistive layers and the two segments of the electrically conducting structured layer of the snubber substrate.

3. The snubber circuit of claim 2, wherein the first electrically conductive interconnecting layers are configured to have the effect of a heat capacitance.

4. The snubber circuit of claim 2, further comprising:
second electrically conductive interconnecting layers disposed between the two electrically resistive layers and the two terminals of the capacitor.

5. The snubber circuit of claim 4, wherein the second electrically conductive interconnecting layers are configured to have the effect of a heat capacitance.

6. The snubber circuit of claim 1, wherein the two electrically resistive layers have a resistivity of more than 0.03 $\Omega$m.

7. The snubber circuit of claim 6, wherein the electrically resistive layers comprise material with a homogenous resistivity distribution.

8. The snubber circuit of claim 1, wherein the two electrically resistive layers have a height that is equal to or less than $\frac{1}{5}$ of the square root of a basic area of the respective electrically resistive layer.

9. The snubber circuit of claim 8, wherein the electrically resistive layers comprise material with a homogenous resistivity distribution.

10. The snubber circuit of claim 1, wherein the two electrically resistive layers comprise doped semiconductor material.

11. The snubber circuit of claim 1, wherein the terminals of the capacitor are arranged at lateral ends of the capacitor and have a shape of a cuboid end cap.

12. The snubber circuit of claim 1, wherein the terminals of the capacitor are arranged at lateral ends of the capacitor and have an L-shape.

13. A power semiconductor module, comprising:
a module substrate comprising an electrically insulating carrier and an electrically conducting structured module layer applied thereon, the electrically conducting structured layer including multiple segments;
at least one semiconductor switching device disposed on the module substrate and electrically connected to the electrically conducting structured layer; and
at least one snubber circuit disposed on the module substrate and connected via the electrically conducting structured layer of the module substrate to the at least one semiconductor switching device, the at least one snubber circuit comprising:
a snubber substrate comprising an electrically insulating carrier and an electrically conducting structured layer applied thereon, the electrically conducting structured layer of the snubber substrate including two segments;
two electrically resistive layers, each resistive layer being applied onto the two segments of the electrically conducting structured layer of the snubber substrate; and
a capacitor disposed on the electrically resistive layers and having two terminals, each terminal being electrically connected to one of the electrically resistive layers.

14. The power semiconductor module of claim 13, wherein the at least one snubber circuit is disposed in close proximity to the at least one semiconductor switching device.

15. The power semiconductor module of claim 13, wherein the snubber substrate is part of the module substrate.

16. The power semiconductor module of claim 13, wherein the at least one semiconductor switching device is a silicon-carbide metal-oxide field-effect transistor.

17. The power semiconductor module of claim 13, wherein the at least one snubber circuit further comprises a snubber diode.

18. The power semiconductor module of claim 13, wherein the at least one snubber circuit is disposed in the center of the module substrate.

\* \* \* \* \*